US006597259B1

(12) United States Patent
Peters

(10) Patent No.: US 6,597,259 B1
(45) Date of Patent: Jul. 22, 2003

(54) SELECTIVE LAMINATED FILTER STRUCTURES AND ANTENNA DUPLEXER USING SAME

(76) Inventor: James Michael Peters, 104 E. Second St., Frederick, MD (US) 21701

(*) Notice: Subject to any disclaimer, the term of this patent is extended or adjusted under 35 U.S.C. 154(b) by 138 days.

(21) Appl. No.: 09/758,935

(22) Filed: Jan. 11, 2001

Related U.S. Application Data

(60) Provisional application No. 60/175,400, filed on Jan. 11, 2000.

(51) Int. Cl.[7] .......................... H01P 1/213; H01P 5/12; H03H 7/01

(52) U.S. Cl. ........................ 333/134; 333/204; 333/185

(58) Field of Search ................................ 333/134, 204, 333/185, 205, 175

(56) References Cited

U.S. PATENT DOCUMENTS 4,701,727 A 10/1987 Wong ......................... 333/204
4,742,562 A 5/1988 Kommrusch ................. 455/78
5,248,949 A 9/1993 Eguchi et al. .............. 333/204
5,373,271 A 12/1994 Hirai et al. ................. 333/205
5,448,209 A 9/1995 Hirai et al. ................. 333/204
5,519,366 A * 5/1996 Kaneko et al. ............. 333/204
5,719,539 A 2/1998 Ishizaki et al. ............. 333/204
5,892,415 A * 4/1999 Okamura ..................... 333/175
6,020,799 A 2/2000 Ishizaki et al. ............. 333/204
6,114,925 A * 9/2000 Lo ............................. 333/185
6,191,666 B1 * 2/2001 Sheen ........................ 333/185
6,222,431 B1 * 4/2001 Ishizaki et al. ............. 333/206
6,294,967 B1 * 9/2001 Hirai et al. ................. 333/202
6,437,665 B1 * 8/2002 Kato .......................... 333/185
6,437,666 B1 * 8/2002 Matsumura et al. ........ 333/184

* cited by examiner

*Primary Examiner*—Robert Pascal
*Assistant Examiner*—Dean Takaoka
(74) *Attorney, Agent, or Firm*—Baker Botts LLP

(57) ABSTRACT

A laminate dielectric filter that has an asymmetrical band pass response is formed with a dielectric laminate structure that includes a first dielectric layer, a second dielectric layer and a third dielectric layer. A first resonator element and a second resonator element are interposed between the first and second dielectric layers and are arranged in a spaced apart relationship from one another. The first and second resonator elements each have a first end electrically connected to a circuit ground potential and a second end which is open circuited. Coupling structures are coupled to the first and second resonator elements to provide input/output ports for the filter. A third resonator element which has a first end electrically connected to a circuit ground potential and a second end which is open circuited is interposed between the second and third dielectric layers and is positioned to be disposed between the first and second resonators such that the first, second and third resonator elements are magnetically coupled to each other. A coupling element is provided that has a width and a position, spaced from said first ends of said first and second resonator elements, to form a coupled triplet having an asymmetrical filter response with all zeros of the response on only one side of the filter pass band.

26 Claims, 10 Drawing Sheets

SELECTIVE LAMINATED FILTER STRUCTURES AND ANTENNA DUPLEXER USING SAME

This application claims the benefit of U.S. Provisional Patent Application Serial No. 60/175,400, filed on Jan. 11, 2000 and entitled "Selective Laminated Antenna Duplexer and Selective Laminated Filters."

FIELD OF THE INVENTION

The present invention relates generally to radio frequency (RF) filters and more specifically to dielectric antenna duplexer and dielectric filter topologies suitable for use in portable electronic devices, such as mobile telephony equipment.

BACKGROUND OF THE INVENTION

It is well known that state of the art communications systems require high performance filtering devices in order to maximize performance and comply with federal communications laws and standards. These devices are formed to be highly frequency selective by minimizing signal loss within a desired passband and significantly attenuating unwanted signals which reside outside the passband. However, the constraints which are imposed when size reduction of RF filters is desired while maintaining the performance level of such devices makes current filter topologies impractical for many applications. The development of new filter topologies that produce transfer functions with multiple transmission zeroes is one answer to these design constraints. Of course, to realize actual devices, the circuit topologies that implement these transfer functions must have realizable element values for the media in which the devices are constructed.

Current filter topologies, such as the one described in U.S. Pat. No. 5,488,335, employ the technique of resonating the coupling elements between resonant sections of the described device in order to produce finite transmission zeroes. This technique has been used in multi-layer planar circuits but the element values are too large to effectively implement highly selective transfer functions. To the contrary, only relatively non-selective transfer functions may be implemented in this manner, as is exemplified in the response graphs of FIG. 6*a* and FIG. 6*b* of U.S. Pat. No. 5,719,539. One qualitative measure of this selectivity is the relative proximity the transmission zeroes to the passband. The device described in U.S. Pat. No. 5,488,335 meets generally performance requirements, but it is not suitable for further size reduction, nor is it well suited for integration with other constituent parts of the RF front end of a portable communications device (i.e., subscriber unit). Accordingly, such a topology cannot readily be applied to such structures as antenna duplexers.

In contrast, while the devices described in U.S. Pat. No. 5,719,539 are suitable for further size reduction and system integration, such devices lack generally useful performance characteristics.

Another known method of forming a communications filter, such as a band pass filter, is to couple multiple resonant structures which reside within one or more tuned cavities. An example of such a filter is illustrated in U.S. Pat. No. 5,936,490 to Hershtig (the '490 patent) which is directed to a filter formed with coupled tri-sections or coupled triplets. In the '490 patent, a filter is formed with three high dielectric resonators placed within corresponding cylindrical cavities which are mutually coupled either through aperture coupling or probe coupling. Although the use of coupled triplets provides a desirable response, the construction of the filter using cylindrical cavities results in a form factor which is too large for certain applications.

Accordingly, there remains a need for filter topologies which provide high performance in a relatively compact design.

OBJECTS AND SUMMARY OF THE INVENTION

It is an objective of the present invention to provide a physically small, selective laminated filter structure which is suitable for integration within a communications system.

It is another objective of the present invention to provide a physically small, selective laminated ceramic antenna duplexer that is suitable for integration within a communications system.

It is a further objective of the present invention to provide filter topologies that produce multiple transmission zeroes with realizable element values.

In accordance with the invention a laminate dielectric filter is provided which exhibits an asymmetrical band pass response. The filter includes a dielectric laminate structure including a first dielectric layer, a second dielectric layer and a third dielectric layer. A first resonator element and a second resonator element are interposed between the first and second dielectric layers. The first and second resonator elements are arranged in a spaced apart relationship from one another and have a first end electrically connected to a circuit ground potential and a second end which is open circuited. A coupling structure is operatively coupled to each of the first resonator element and second resonator element to provide input/output ports to the filter. A third resonator element having a first end electrically connected to a circuit ground potential and a second end which is open circuited, is interposed between the second and third dielectric layers and is positioned to be disposed between the first and second resonators. A coupling element is operatively coupled to the first and second resonator elements and has a width and a position, spaced from said first ends of said first and second resonator elements, to form a coupled triplet having an asymmetrical filter wherein all transmission zeros of the response are on only one side of the filter pass band.

The resonators are preferably TEM (transverse electromagnetic) mode resonators. In one embodiment, the resonators are arranged so that the adjacent resonators form an inter-digital structure. This structure is formed by grounding the resonators on alternating ends of adjacent resonators. In this case, the coupling element is provided between the two non-adjacent resonators to produce three transmission zeroes above the pass-band. The mode of coupling between adjacent resonators is primarily electric, whereas the coupling between non-adjacent resonators is predominantly magnetic.

Alternatively, the resonators can be arranged such that all resonators are coupled to ground on adjacent ends to provide a comb-line filter section. Coupling in this type of section is primarily due to fringing fields between resonators. In this embodiment, capacitive stub pairs between adjacent resonators are provided which move the transmission zeroes below the pass-band of the structure. Each stub pair produces a transmission zero.

An additional aspect of this embodiment is the connection point of the open circuit stubs. Distributed circuits tend to have additional passbands when the length of the transmission line resonators is roughly an odd multiple of a quarter wavelength long. However, it can be seen such spurious pass bands may be suppressed if, when a line is resonant, the length from the short circuited end to the connection point is one-half wavelength, or a multiple thereof, with respect to the spurious frequency, while the electrical distance from the open circuited to connection point is an odd multiple of a one-quarter wavelength with respect to the spurious frequency. Under these conditions, the connection point of such a resonator is at a voltage null, and a series resonance is presented that short-circuits the spurious signal to ground.

In a further embodiment, the coupling element includes a transmission line whose ends overlap the non-adjacent resonators. These overlap sections act as capacitors. The addition of this transmission line element forms a structure similar to a coupled triplet filter section. The added non-adjacent coupling elements do not produce any additional zeroes but cause a frequency separation of existing zeroes in the described section.

Another embodiment of the invention provides a laminated dielectric filter which includes at least three TEM mode resonators which are arranged such that all resonators are at ground potential on adjacent ends. The structure described is a comb-line filter section. In this alternate embodiment, the coupling element takes the form of a transmission line whose ends connect to the non-adjacent resonators. The addition of this transmission line causes the coupling zeroes to shift from the low side of the pass band to the high side of the passband.

Also in accordance with the invention is a laminated dielectric antenna duplexer. The duplexer generally includes first and second coupled triplet filter sections which are cooperatively coupled with a matching structure interposed therebetween. The coupled triplet sections can take on the form of any of the filter section embodiments described herein.

One aspect of this embodiment is a juxtaposition of the constituent filters so that they share a common ground plane.

A second aspect of the present embodiment is an arrangement of the constituent filters so that all ceramic and metal layers are common.

A third aspect of the present embodiment is the matching network connecting the constituent filters.

DETAILED DESCRIPTION OF PREFERRED EMBODIMENTS

Figure 1A:
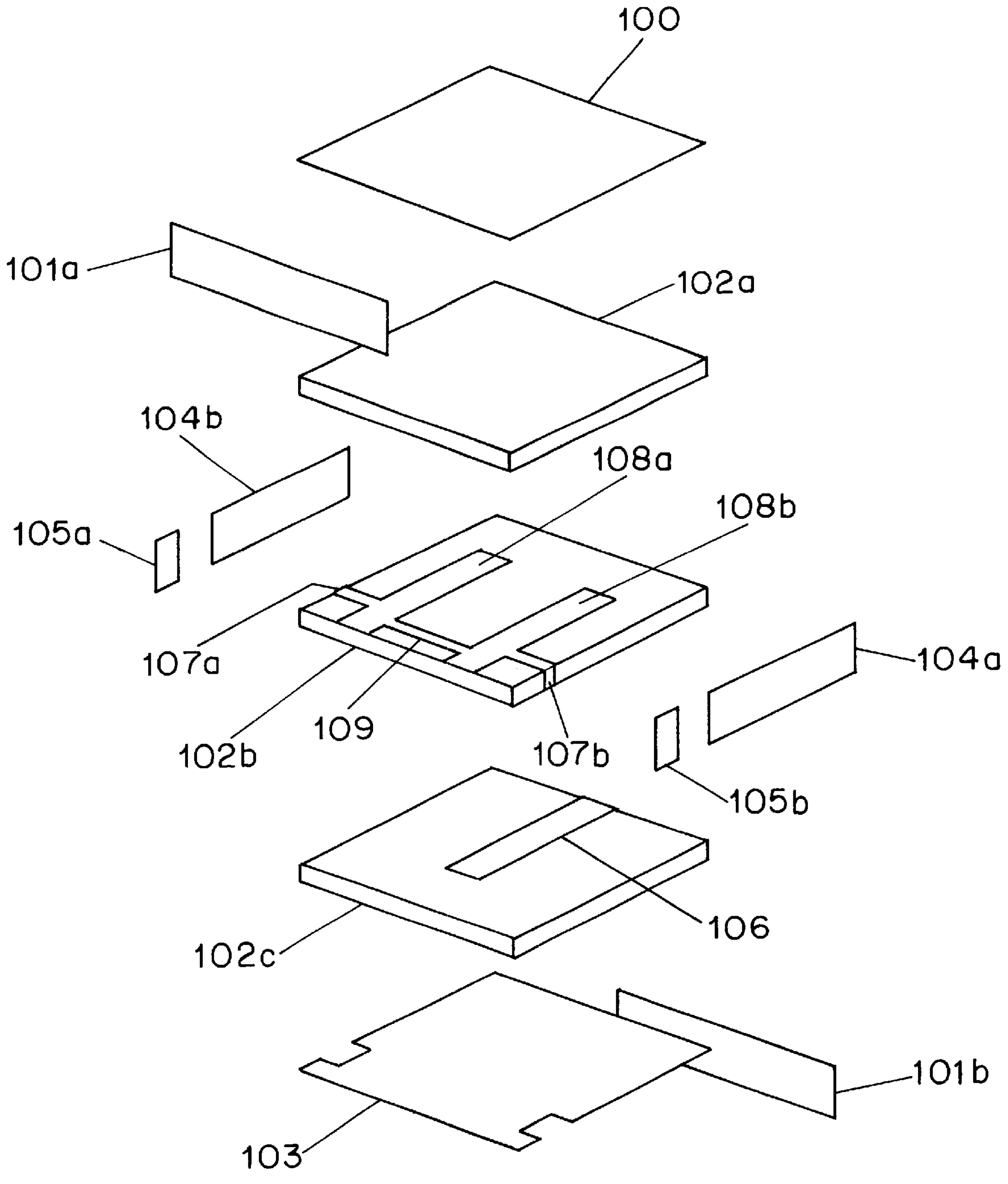
FIG. 1A is a perspective exploded view of a laminate dielectric filter in a first embodiment of the invention.

A first embodiment of the present invention will be described in connection with FIGS. 1A–1C. FIG. 1A is a perspective view of a dielectric filter formed in accordance with the present invention. The filter is formed as a laminate having three dielectric layers 102*a*, 102*b*, and 102*c*. The dielectric layers can be formed from many low loss dielectric materials known in the art, such as various ceramic compositions. Preferably, the dielectric material selected exhibits a high dielectric constant, such as in the range of 45 and the layers have a thickness on the order of 20 mils (0.020 inch).

Input/output transmission lines 107*a* and 107*b* are formed on dielectric layer 102*b* and are coupled to strip line resonator electrodes 108*a* and 108*b*, respectively, which are also formed on dielectric layer 102*b*. Together, these elements form tapped line inputs to the filter structure. The strip line resonator electrodes generally have a physical length which results in an electrical length substantially equal to one quarter of a wavelength at the center frequency of the filter passband ($\lambda/4$). The physical length will vary based on the velocity factor of the dielectric material with respect to air. The width of the strip line resonator electrodes will vary based upon a number of factors, such as the characteristic impedance of the system and the desired filter response. These parameters can readily be modeled and optimized using a microwave circuit simulation tool.

The resonator electrodes 108*a*, 108*b* are interconnected via a coupling element 109 which is formed on dielectric layer 102*b* and is interposed between the resonator electrodes. Coupling element 109 is formed as a transmission line that exhibits the characteristics of an inductor. Coupling element 109 has a width and position which are selected to shift the transmission zeros from the low side of the filter pass band to the high side of the filter pass band. For example, as the position of coupling element 109 is moved towards the open circuited end of resonator elements 108*a* and 108*b*, the position of the transmission zeroes move towards the passband of the filter. In addition, the coupling between these elements also increases with this change in position of the coupling element 109.

Strip line resonator electrode 106 is interposed between dielectric layer 102*c* and dielectric layer 102*b*. Referring to the top plan view of FIG. 1B, the strip line resonator electrode 106 is positioned on dielectric sheet 102*c* to be substantially laterally disposed between the strip line resonator electrodes 108*a* and 108*b* in an interdigital configuration. However, being formed on a different level of the dielectric laminate, the resonator electrode 106 is vertically offset from resonator electrodes 108*a* and 108*b* by the width of dielectric layer 102*b*. Conductive members 101*a*, 101*b*, 104*a*, 104*b*, 105*a* and 105*b* circumscribe the perimeter of the laminate structure and provide a grounding electrode. Preferably, the conductive members are formed by edge plating or other form of metallic deposition process. The outside surfaces of dielectric layers 102*a* and 102*c* are covered with conductive layers 100, 103, respectively, which are electrically coupled to the conductive members 101*a*, 101*b*, 104*a*, 104*b*, 105*a* and 105*b*, thereby forming a substantially continuous grounding structure about the outside surface of the filter.

Figure 1B:
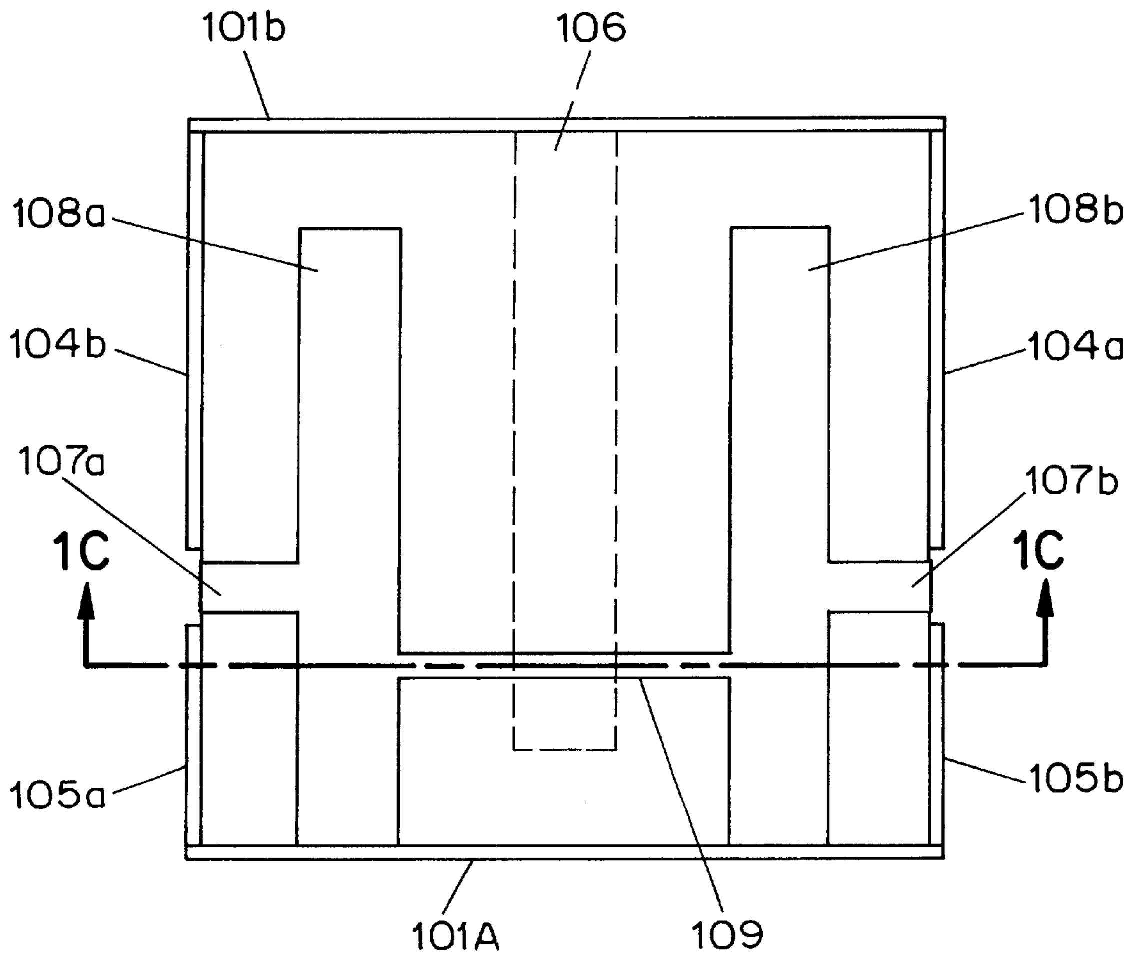
FIG. 1B is a top plan view of the laminate dielectric filter of FIG. 1A.

Referring to FIG. 1B, a first end of electrode 108*a* and electrode 108*b* extend to the edge of dielectric layer 102*b* so as to electrically contact the conductive strip 101A. Similarly, an opposite end of electrode 106 extends to the edge of dielectric layer 102C and contacts conductive strip 101B. In this way, opposite ends of adjacent resonator electrodes are electrically connected to a ground potential through a low inductance connection. Of course, it will be appreciated that other arrangements for grounding the resonators can be used, such as selective edge plating or the use of plated via's to a ground plane layer (not shown).

The strip line resonator electrodes 106, 108*a* and 108*b* are preferably tangential electromagnetic mode (TEM) resonators which can be described by TEM network theory. FIG. 2 shows an equivalent circuit model of the dielectric filter of FIGS. 1A–1C. All transmission line elements depicted in the model are four port devices. Capacitors C1, C2 and C3 are included for completeness and represent the added capacitance at the open end of each resonator electrode. Transmission line elements Z11, Z11*a*, Z11*b*, Z11*c* and Z11*d* represent resonator electrode 108*a*. Transmission line elements Z22, Z22*a*, and Z22*b* represent resonator electrode 106. Transmission line elements Z33, Z33*a*, Z33*b*, Z33*c* and Z33*d* represent resonator electrode 108*b*. Transmission line element Z13 represents coupling element 109. Transmission line element Z12 represents the coupling between resonator electrodes 106 and 108*a*. Transmission line element Z23 represents the coupling between resonator electrodes 106 and 108*b*.

Figure 3:
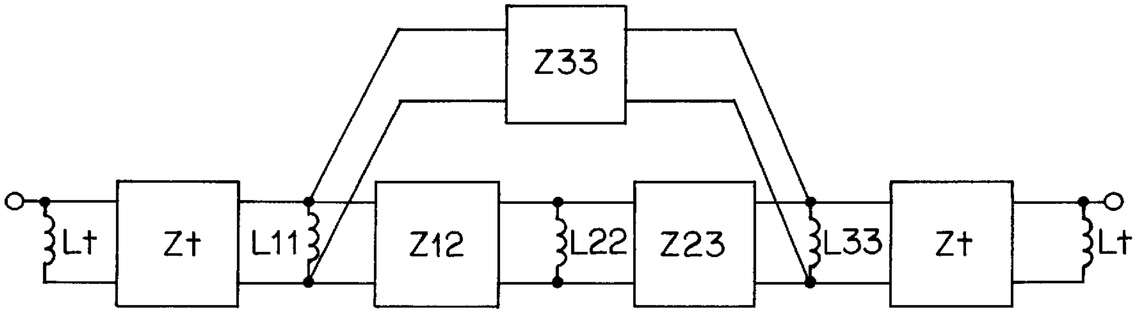
FIG. 3 is a schematic diagram of a simplified circuit model of the laminate filter of FIG. 1A.

FIG. 3 is a schematic diagram that illustrates a simplified circuit model of the dielectric filter in the first embodiment, which is suitable for design simulations and modeling. In this case, resonator electrodes 108*a*, 108*b* and 106 are represented by inductors L11, L22 and L33. These inductors represent the short circuited transmission lines where $$L_{i,i} := \frac{Z_{i,i}}{2 \cdot \pi \cdot f} \cdot \tan\left(\frac{\pi}{2} \cdot \frac{f}{fs}\right)$$

The transmission line elements in this model are two port models rather than four port models. Input electrodes 107 and 107*a* are replaced by an equivalent circuit containing an inductance Lt and a transmission line Zt. All other transmission elements depicted in the previous model are replaced with two ports in this model.

Figure 1C:
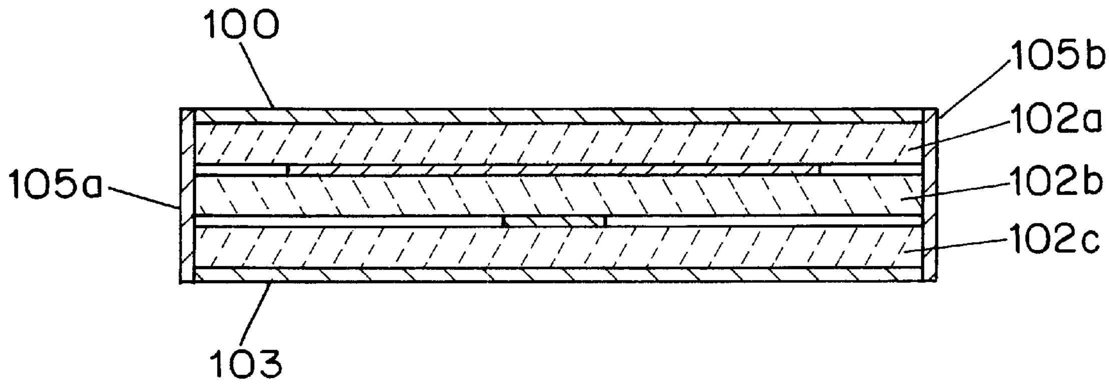
FIG. 1C is across-sectional view of the laminate dielectric filter of FIG. 1A.
Figure 1D:
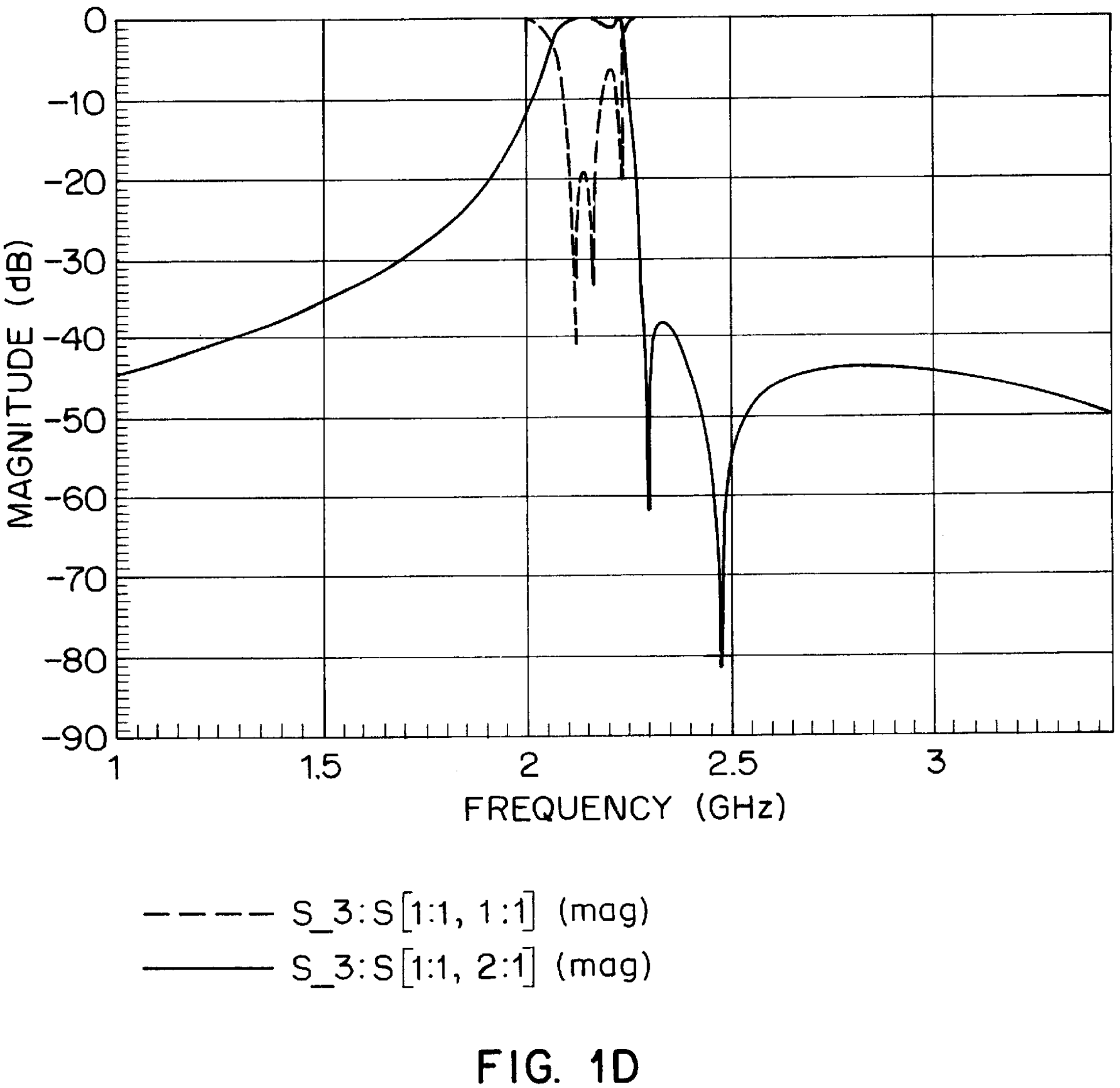
FIG. 1D is a graph illustrating the S-parameter filter response of an exemplary embodiment of the laminate dielectric filter of FIG. 1A.
Figure 2:
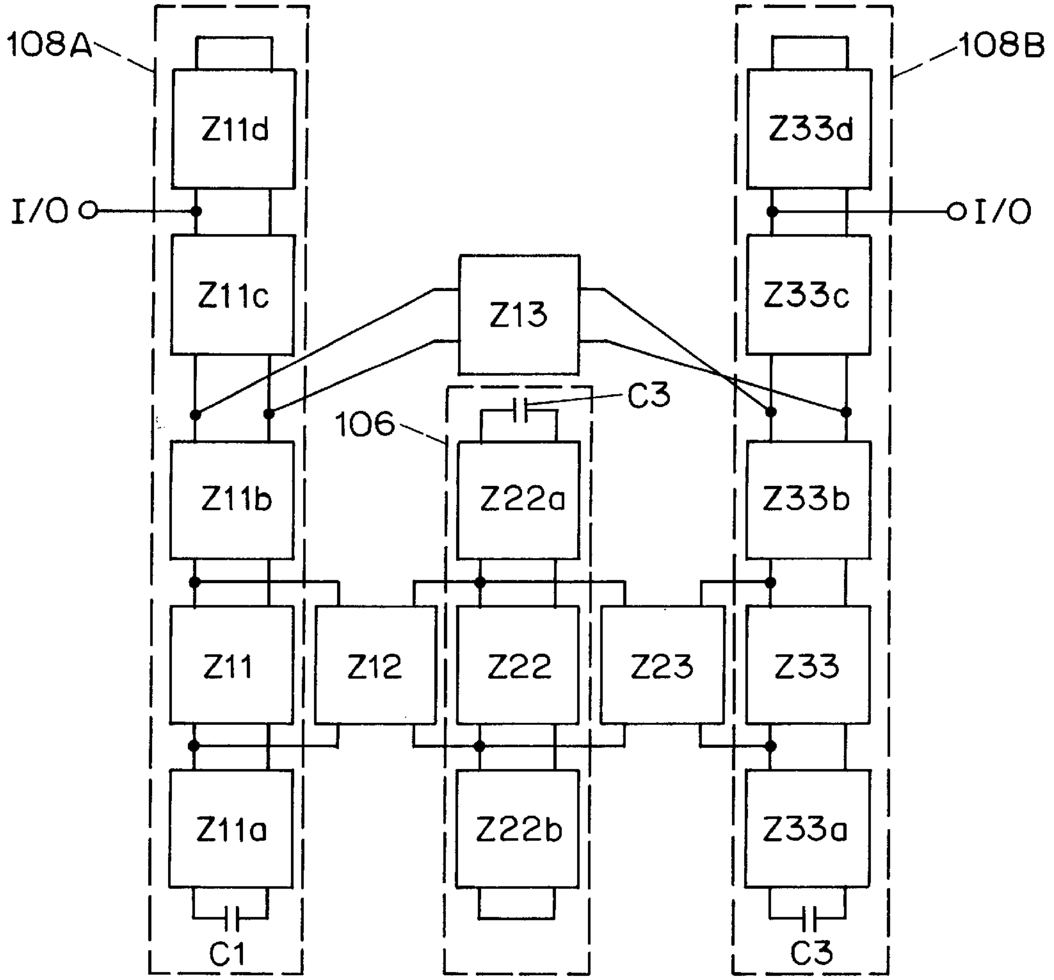
FIG. 2 is a schematic diagram of an equivalent circuit model of the laminate dielectric filter of FIG. 1A.

Referring to FIG. 1D, the filter topology of FIGS. 1A–1C is a form of coupled triplet which provides an asymmetrical response with two zeros 110, 112 in the filter response located on the high frequency side of the filter passband. To accomplish this response, the width of transmission line 109 and the location of transmission line 109 from the grounded end of resonator electrodes 108*a* and 108*b* can be adjusted, such as by varying these parameters using a computer aided design model and observing the resulting response. The characteristics within the passband will be dictated in large part on the degree of coupling between the resonator elements 106, 108*a* and 108*b*. The degree of coupling can be adjusted by changing the spacing between the resonator elements.

Figure 4A:
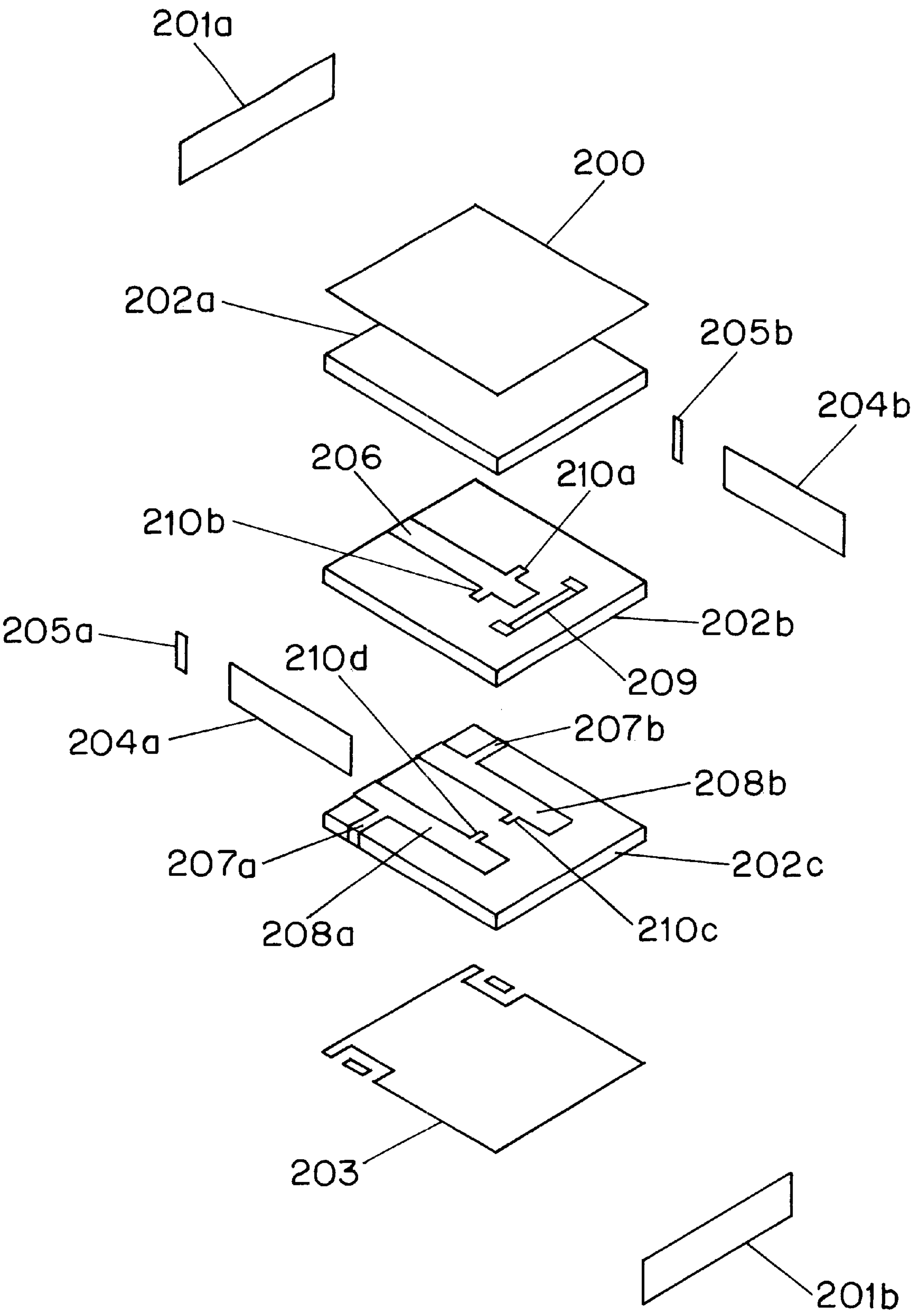
FIG. 4A is a perspective exploded view of a second embodiment of a laminate dielectric filter in accordance with the invention.

A laminated dielectric filter in accordance with a second embodiment of the invention is described below with reference to FIGS. 4A–4C. The construction depicted in FIG. 4A, which is a perspective view of a dielectric filter, is substantially the same as that described in connection with FIGS. 1A–1C with a number of dielectric layers 202*a*, 202*b*, and 202*c* forming a laminate structure and conductive elements 200, 201*a*, 201*b*, 203, 204*a*, 204*b*, 205*a* and 205*b* forming a substantially continuous grounding electrode on the outer surface of the filter. Input electrodes 207*a* and 207*b* are formed on dielectric layer 202*c* and are coupled to strip line resonator electrodes 208*a* and 208*b*, respectively. A strip line resonator electrode 206 is formed between dielectric layer 202*a* and dielectric layer 202*b* and is positioned to be substantially disposed between the strip line resonator electrodes 208*a* and 208*b*. Adjacent first ends of the resonator electrodes 208*a*, 208*b* and 206 are connected to a ground potential to form a comb line structure. Such grounding can be accomplished by having the end of the resonator electrode extend to the edge of the laminate and contact the conductive element 201*a*. Coupling electrode 209 is formed on dielectric layer 202*b*. Coupling electrode 209 is formed with capacitive end sections 209*a* and 209*b* that extend over the open circuited ends of strip line resonator electrodes 208*a* and 208*b*, respectively.

Figure 4B:
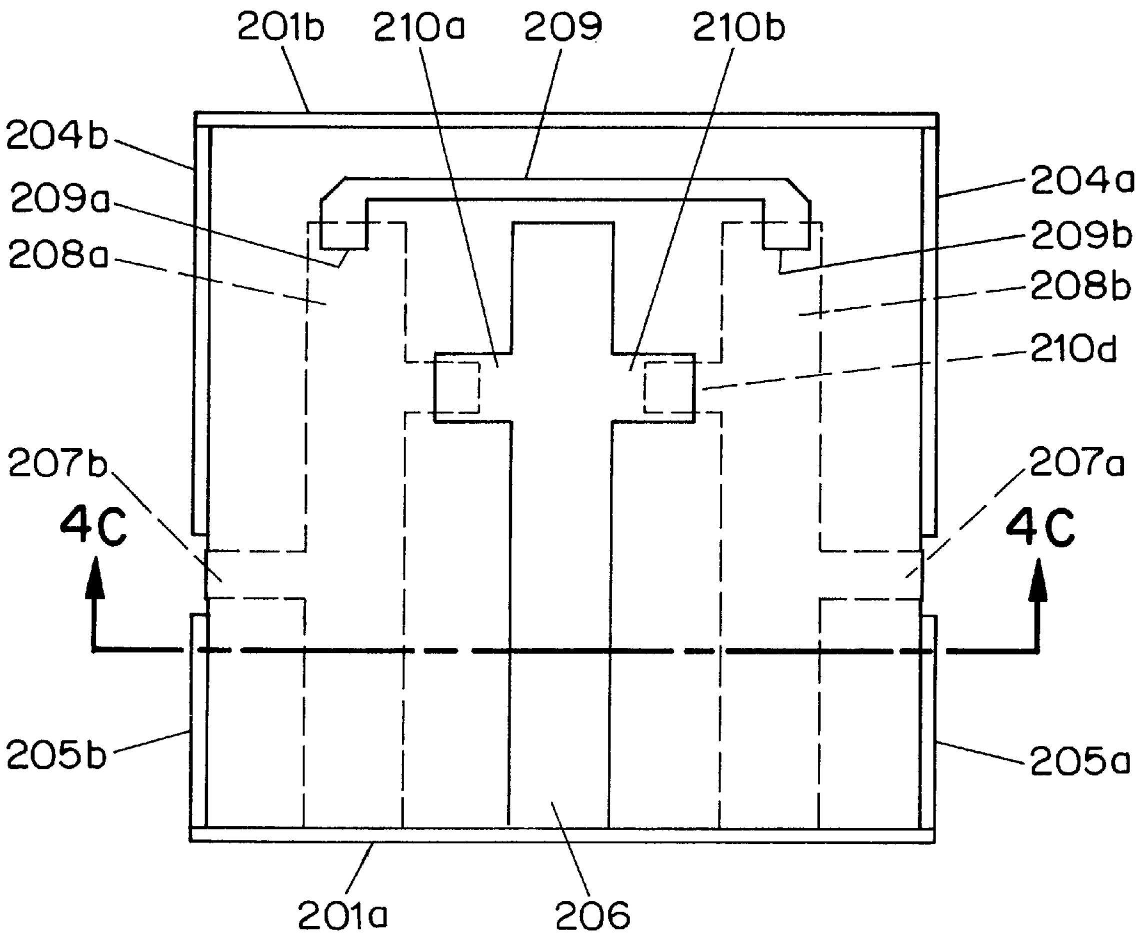
FIG. 4B is a top plan view of the laminate dielectric filter of FIG. 4A.
Figure 4C:
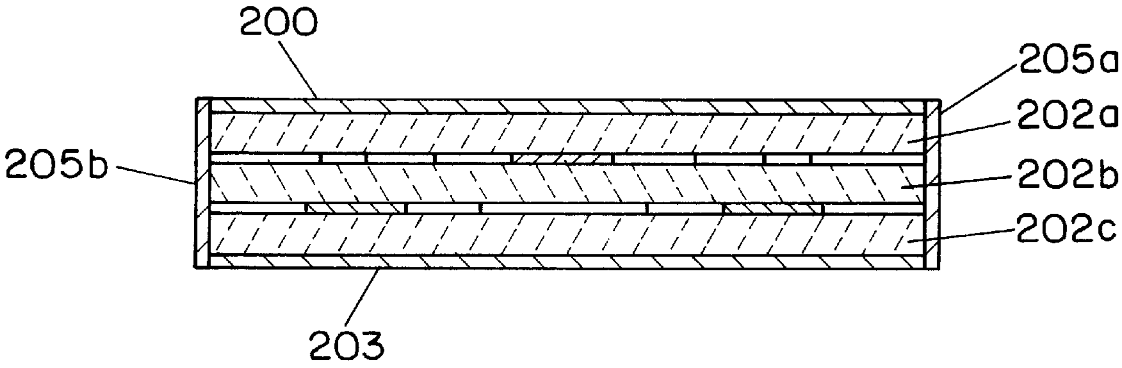
FIG. 4C is a cross-sectional view of the laminate dielectric filter of FIG. 4A.

Referring to FIG. 4B, open circuited stubs 210*a* and 210*b* extend from resonator 206. Similarly, open circuited stubs 210*c* and 210*d* extend from resonator electrodes 208*b* and 208*a*, respectively. The open circuited stubs are positioned on the respective dielectric layers such that they overlap vertically, separated by dielectric layer 202*b*, and cooperate as stub pairs 210*a*, 210*c* and 210*b*, 210*d*. The stub pairs, which act as coupling capacitors between adjacent resonator electrodes, move the transmission zeros of the comb-line structure from within the filter passband to a frequency below the passband. In this way, all of the transmission zeros of the filter response are moved to the low side of the passband.

In addition, if spurious frequency suppression is desired, the stub pairs 210*a*, 210*c* and 210*b*, 210*d* can be positioned at a point along the length of the resonators which is a half wavelength, or multiple thereof, from the grounded end of the resonators and an odd multiple of a quarter wavelength, at the spurious frequency, from the open circuited end of the resonators. This connection point on the resonator is at a voltage null and the resonance appears as a series resonance which short circuits the spurious signal to ground.

Coupling electrode 209, which provides coupling between non-adjacent resonator elements 208*a*, 208*b*, does not introduce additional transmission zeroes but results in a frequency separation of the existing zeroes which are provided by the stub pairs 210*a*, 210*c* and 210*b*, 210*d*.

As with FIG. 1, the topology of FIG. 4A provides a coupled triplet topology with an asymmetrical filter response with all zeros placed on one side of the filter passband. In the interdigital embodiment of FIG. 1A, the zeroes are moved above the passband. In the comb-line embodiment of FIG. 4A, the zeroes are moved below the passband. In FIG. 4A, this response is achieved by optimizing the size and placement of the stub pairs and coupling electrode 209 This is readily accomplished by allowing these parameters to be variables in a microwave circuit design model using suitable computer circuit-modeling software.

Figure 5:
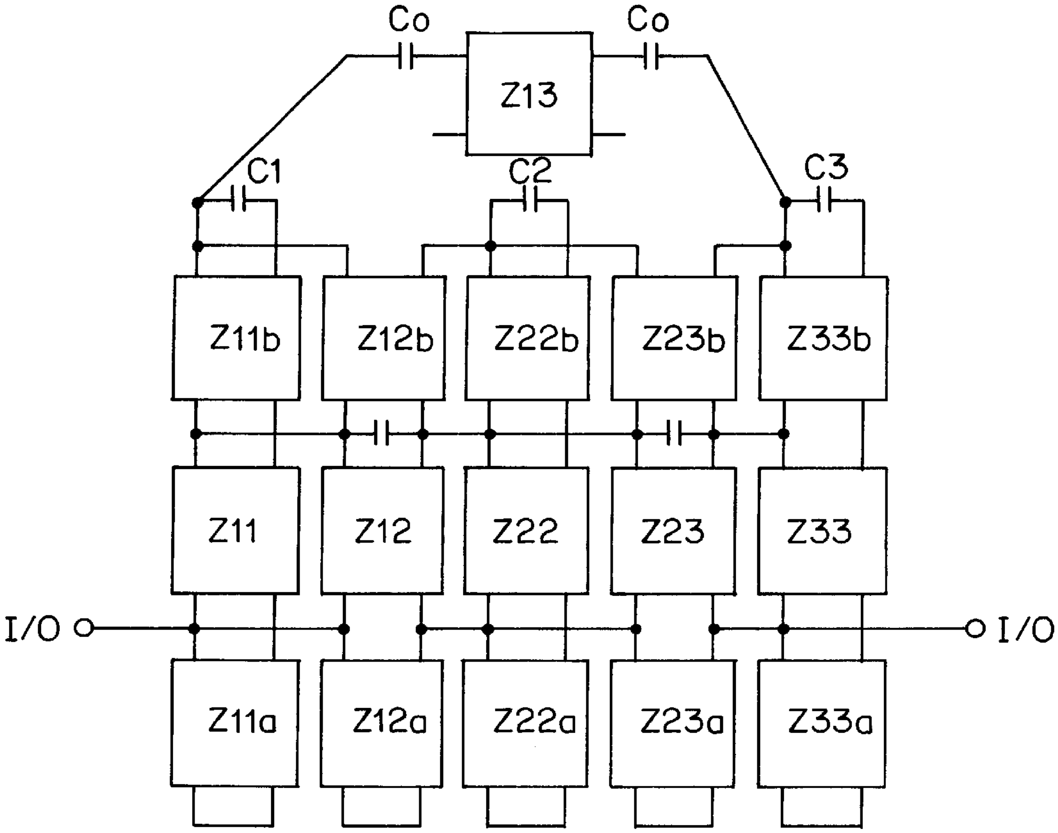
FIG. 5 is a schematic diagram of an equivalent circuit model of the laminate filter of FIG. 4A.

The strip line resonator electrodes 206, 208*a* and 208*b* are preferably TEM resonators which can be described by TEM network theory. FIG. 5 is a schematic diagram which shows an equivalent circuit model of the dielectric of FIG. 4A. The transmission line elements depicted in the model are four port devices. Capacitors C1, C2 and C3 are included in the model to represent the capacitance resulting from the open end of each resonator electrode. In this model, transmission line elements Z11, Z11*a* and Z11*b* represent resonator electrode 208*a*. Similarly, transmission line elements Z22, Z22*a*, and Z22*b* represent resonator electrode 206. Transmission line elements Z33, Z33*a*, and Z33*b*, represent resonator electrode 208*b*. Transmission line element Z13 represents coupling element 209, the position and width of which are adjusted to place the filter zeros in the desired location in the filter response. Capacitors Ca and Cb represent the overlap among electrodes 209, 208*a*, and 208*b*, respectively. Capacitors C12 and C23 are electric coupling elements and represent the overlap of the open circuit stub pairs. Transmission line elements Z12, Z12*a*, Z12*b* represent the distributed coupling between resonator electrodes 206 and 208*a*. Transmission line element Z23, Z23*a*, and Z23*b* represent the distributed coupling between resonator electrodes 206 and 208*b*.

Figure 6:
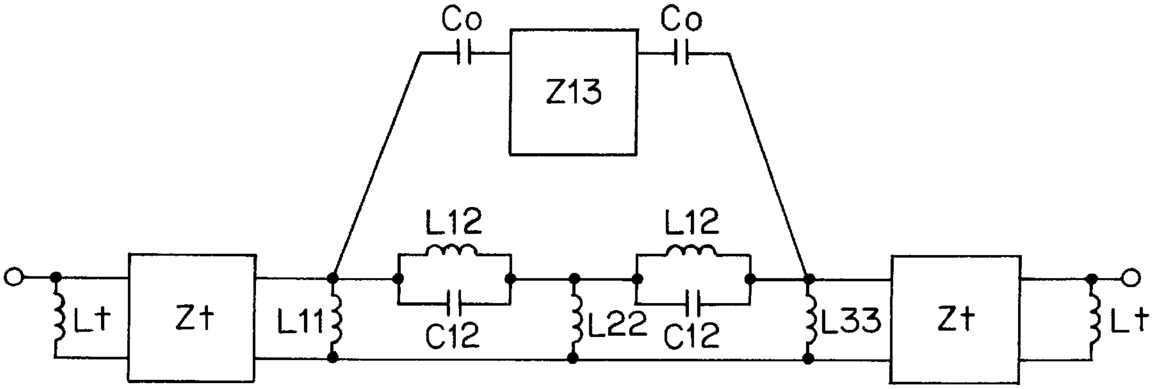
FIG. 6 is a schematic diagram of an approximate circuit model of the laminate filter of FIG. 4A.

FIG. 6 is a schematic diagram illustrating a simplified circuit model of the dielectric filter of FIGS. 4 and 5. In this simplified model, resonator electrodes are represented by inductors L11, L22 and L33 as well as distributed coupling elements L12 and L23. These inductors represent the short circuited transmission lines, where $$L_{i,j} := \frac{L_{i,j}}{2\cdot\pi\cdot f}\cdot\tan\left(\frac{\pi}{2}\cdot\frac{f}{fs}\right)$$

The transmission line elements in this model are represented as two port devices rather than four port devices. Input electrodes 207 and 207*a* are replaced by an equivalent circuit containing an inductance Lt and transmission line Zt.

Figure 7:
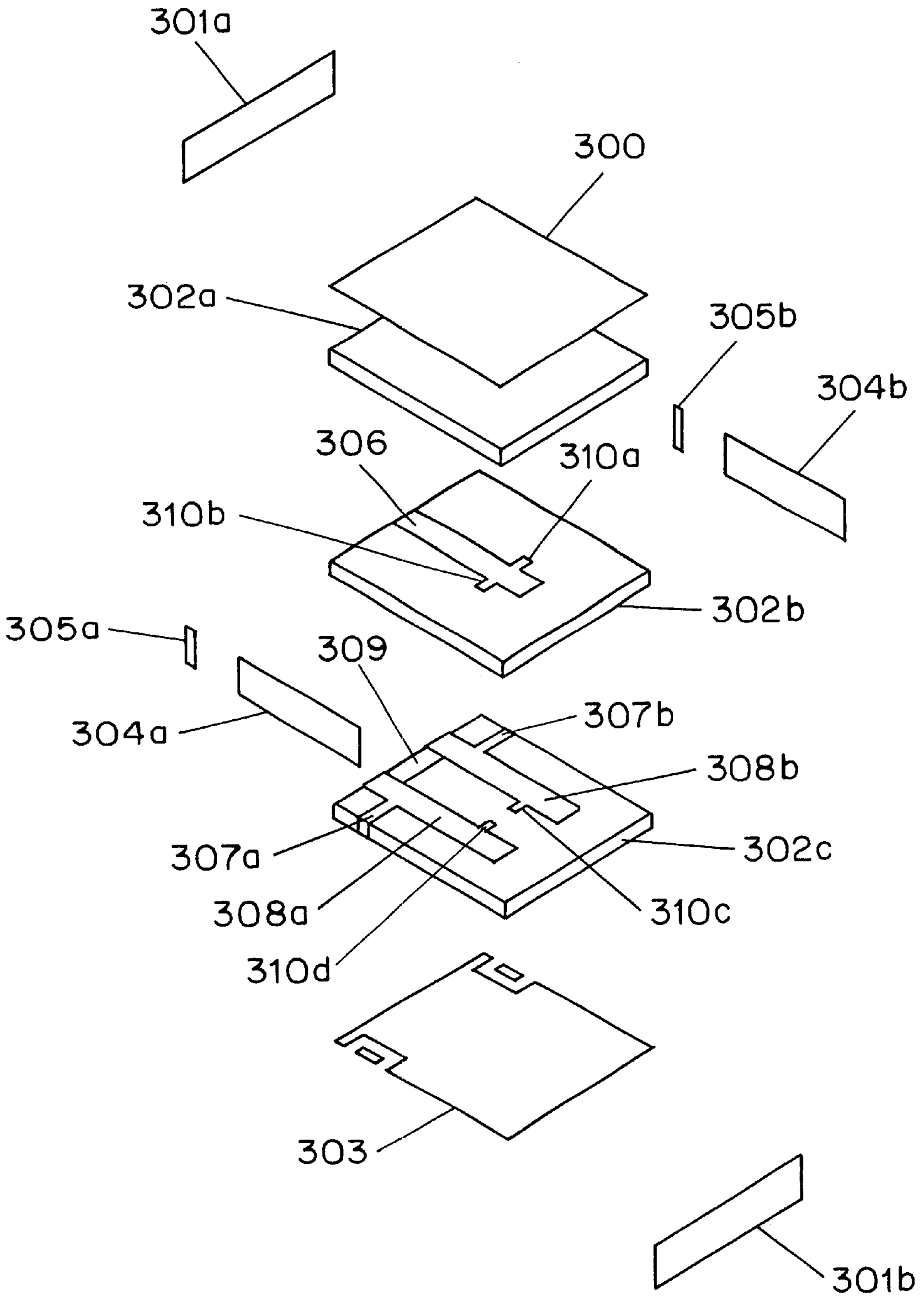
FIG. 7 is a perspective exploded view of a third embodiment of a laminate dielectric filter in accordance with the present invention.

FIG. 7 is a perspective view of a third embodiment of a dielectric filter in accordance with the invention. The construction is substantially the same as in the previous embodiments with conductive members 300, 301*a*, 301*b*, 303, 304*a*, 304*b*, 305*a* and 305*b* forming a substantially continuous grounding electrode about the outside of a laminate structure that includes dielectric layers 302*a*, 302*b*, and 302*c*. A strip line resonator electrode 306 is formed on dielectric layer 302*b*. Input/output coupling structures, in the form of transmission lines 307*a* and 307*b*, are formed on dielectric layer 302*c* and are coupled to strip line resonator electrodes 308*a* and 308*b*, which are also formed on dielectric layer 302*c*.

Open circuited stubs 310*a* and 310*b* extend from resonator 306. The open circuited stubs 310*c* and 310*d* are attached to 308*b* and 308*a*, respectively. The stub pairs 310*a*, 310*c* and 310*b*, 310*d* overlap to provide additional coupling between the adjacent resonator electrodes and move the zeroes of the filter from within the filter passband to a frequency below the passband. As discussed in connection with FIG. 4A, the stub pairs can be positioned along the length of the resonators in order to effect spurious frequency suppression.

The embodiment of FIG. 7 is distinguishable from that of FIG. 4A in that coupling electrode 309 is formed on dielectric layer 302*c* and is sized and positioned with respect to resonator electrodes 308*a* and 308*b* to move the zeroes of the filter to a frequency above the passband. This allows the filter response of FIG. 1A to be achieved in a somewhat smaller configuration which is based on a comb-line arrangement. By altering the width of the coupling electrode and moving the position where the coupling electrode 309 connects to the resonator electrodes, the position of the zeros with respect to the filter passband can be controlled. By allowing these parameters to be variables in a circuit simulation, the ultimate asymmetrical response can be tailored to a particular set of design criteria.

The strip line resonator electrodes 306, 308*a* and 308*b* as shown are TEM resonators which can be described by TEM network theory. As in the embodiment of FIG. 4A, one adjacent end of each resonator electrode is connected to the ground electrode such that the three resonators are in a comb-line arrangement.

Figure 8:
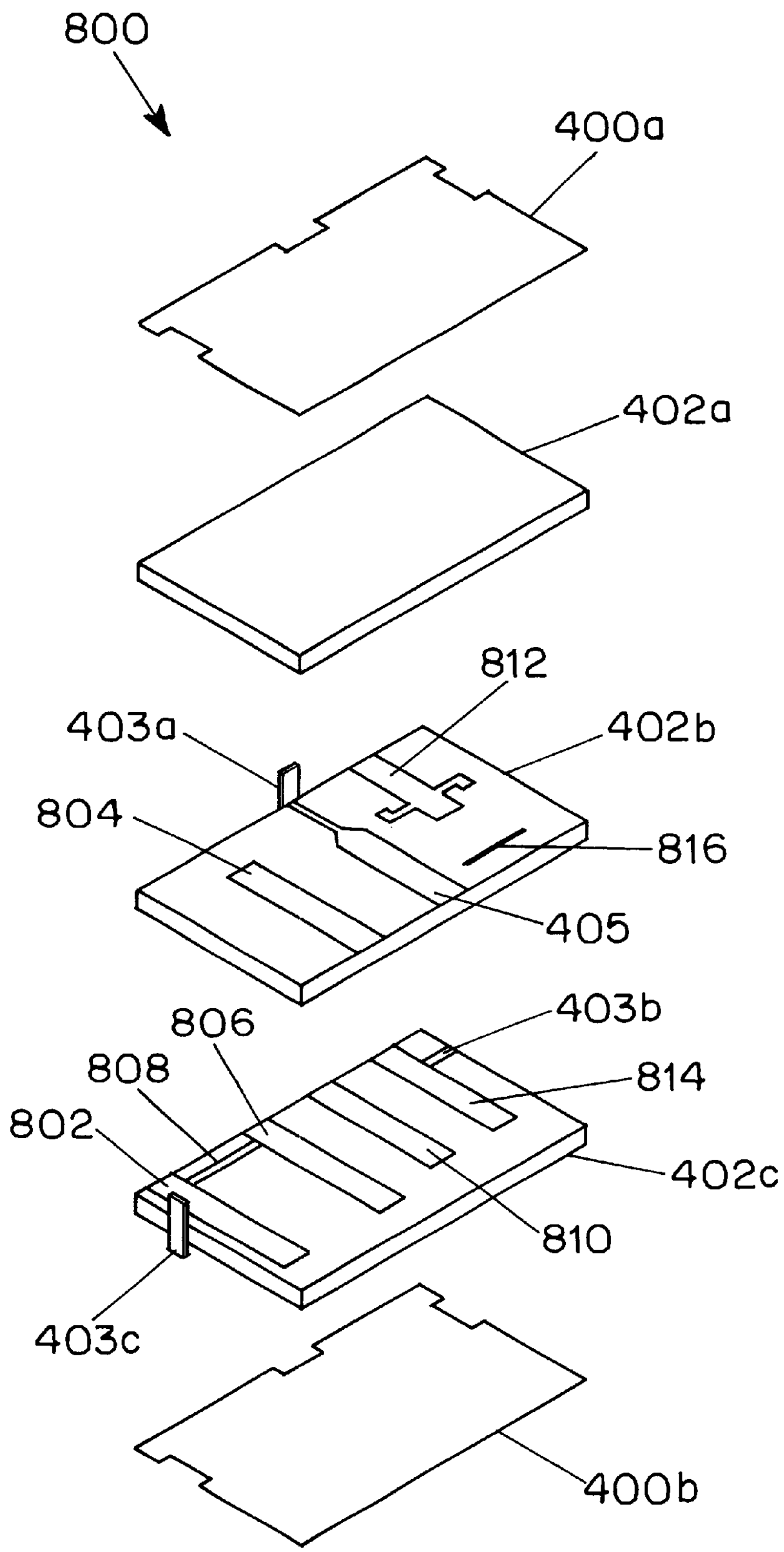
FIG. 8 is a perspective exploded view of a duplexer formed in accordance with the present invention.

FIG. 8 is a perspective view of a dielectric duplexer formed in accordance with the invention. As with the filter embodiments of FIGS. 1, 4 and 7, the duplexer 800 is formed with a laminate structure including dielectric layers 402*a*, 402*b*, and 402*c*. Conductive layers 400 and 400*b* form ground plane layers on the outside surface of dielectric layers 402*a* and 402*c*, respectively. While not shown, edge plating or other conductive members as described in previous embodiments can be employed about the periphery of the laminate structure to form a substantially continuous ground potential electrode.

Figure 9:
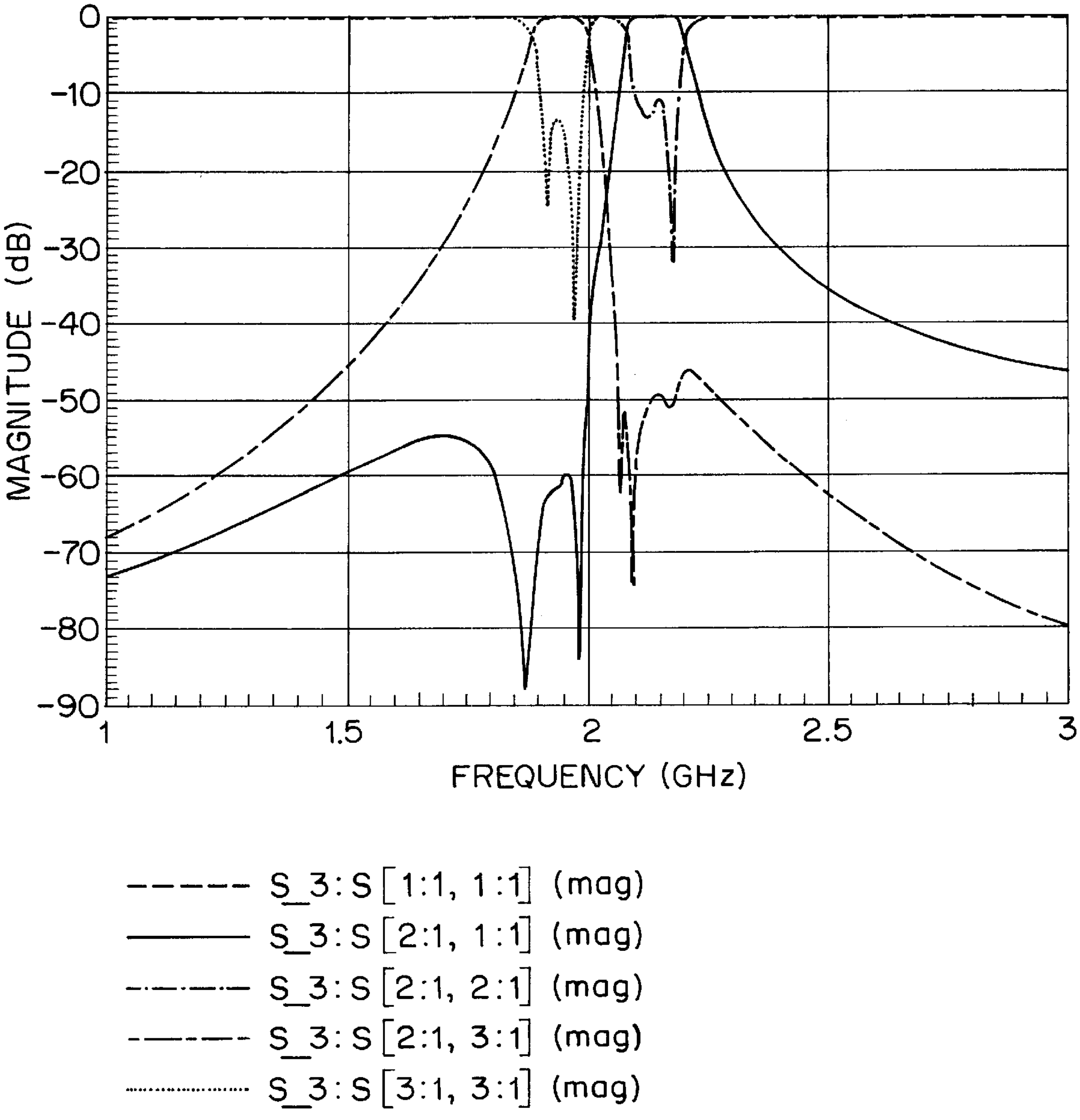
FIG. 9 is a graph illustrating the performance of an exemplary embodiment of the duplexer of FIG. 8.

Electrode 403*a* is a coupling structure, such as a transmission line, and constitutes the antenna port (FIG. 9, port 2). Transmission line 403*b* is coupled to resonator 814 and forms a high band port (port 1). Transmission line 403*c* is operatively coupled to resonator 802 and forms a low band port (port 3).

The duplexer 800 generally includes two coupled triplet filter sections. A first coupled triplet filter section, formed substantially as shown in FIG. 1A, includes resonator elements 802, 804 and 806 and coupling element 808. The second coupled triplet filter section, formed substantially as illustrated in FIG. 4A, includes resonator elements 810, 812 and 814 and coupling element 816. A short circuited transmission line 405, which is connected to electrode 403*a*, is interposed between the coupled triplet filter sections and provides both an impedance matching network and coupling structure interconnecting the two filter sections. The filter sections need not be those which are specifically depicted in FIG. 8, rather, numerous combinations of the various filter section embodiments disclosed herein can be used. For example, the embodiment illustrated in FIG. 7 can replace either section shown.

FIG. 9 is graph illustrating S-parameter data versus frequency for the three ports of the device depicted in FIG. 8.

The embodiments described above provide various realizations of coupled triplet filter sections in a small package. Three resonators can be arranged in an interdigital configuration with a coupling element between the two non-adjacent resonators which shifts the transmission zeroes above the filter passband. Alternatively, three resonators can be arranged in a comb-line configuration with coupling capacitor stub pairs which shift the zeroes below the filter passband and a coupling element that further refines the position of the transmission zeroes. The coupled triplet filter sections, which are realized in a thin laminate structure, are well suited for use in communications components such as duplexers.

The present invention has been described in connection with certain preferred embodiments thereof. It will be appreciated that those skilled in the art can effect minor modifications and changes to such embodiments which are still considered within the scope and spirit of the invention as set forth in the appended claims.

What is claimed is:

1. A laminate dielectric filter having an asymmetrical band pass response comprising:

a dielectric laminate structure including a first dielectric layer, a second dielectric layer and a third dielectric layer;

a first resonator element and a second resonator element, said first resonator element and said second resonator element being interposed between said first and second dielectric layers, said first and second resonator elements being arranged in a spaced apart relationship from one another, each of said first and second resonator elements having a first end electrically connected to a circuit ground potential and a second end which is open circuited;

an input coupling structure operatively coupled to said first resonator element;

an output coupling structure operatively coupled to said second resonator element;

a third resonator element, said third resonator element having a first end electrically connected to a circuit ground potential and a second end which is open circuited, said third resonator element being interposed between said second and third dielectric layers and being laterally disposed between said first and second resonator elements; and a coupling element, said coupling element being operatively coupled to said first and second resonator elements, said coupling element being spaced from said first ends of said first and second resonator elements to form a coupled triplet having an asymmetrical filter response between said input coupling structure and said output coupling structure with all transmission zeros of the response on only one side of the filter pass band, wherein said coupling element is a transmission line which is electrically connected to said first and second resonator elements.

2. The laminate dielectric filter of claim 1, wherein said transmission line is an inductive transmission line.

3. The laminate dielectric filter of claim 1, wherein said first end of said third resonator element is opposite said first end of said first resonator element and said second resonator element.

4. The laminate dielectric filter of claim 1, further comprising:

a first capacitive stub section extending from said first resonator element;

a second capacitive stub section extending from said second resonator element; and third and fourth capacitive stub sections extending from said third resonator element, said third capacitive stub section being arranged to vertically overlap said first capacitive stub section and said fourth capacitive stub section being arranged to vertically overlap said second capacitive stub section.

5. The laminate dielectric filter of claim 4, wherein said third and fourth capacitive stub sections are positioned on said third resonator element to suppress a selected spurious frequency component.

6. The laminate dielectric filter of claim 6 wherein said third and fourth capacitive stub sections are positioned at a multiple of a half wavelength of said spurious frequency component from said first end of said third resonator element and an odd multiple of a quarter wavelength of said spurious frequency component from said second end of said third resonator element.

7. An antenna duplexer comprising:

a laminate structure including a first ground plane layer, a first dielectric layer, a second dielectric layer, a third dielectric layer and a second ground plane layer, said second ground plane layer being electrically coupled to said first ground plane layer;

a first coupled triplet filter section;

a second coupled triplet filter section;

each of said first and second coupled triplet filter sections comprising:

a first resonator element, a second resonator element, and a third resonator element, said first resonator element and said second resonator element being interposed between said first and second dielectric layers and being arranged in a spaced apart relationship from one another, said third resonator element being interposed between said second and third dielectric layers and being laterally disposed between said first and second resonator elements, each of said first, second and third resonator elements having a first end electrically connected to said first and second ground plane layers and an open circuited second end; and a coupling element operatively coupled to said first and second resonator elements at a position spaced from said first ends to form a coupled triplet filter section having an asymmetrical filter response between said input coupling structure and said output coupling structure with all transmission zeros of the response on only one side of the filter pass band;

a coupling stub interposed between said first coupled triplet filter section and said second coupled triplet filter section;

a first port coupled to said first coupled triplet filter section;

a second port coupled to said second coupled triplet filter section; and a third port coupled to said coupling stub.

8. The antenna duplexer of claim 7, wherein at least one of said first coupled triplet filter section and said second coupled triplet filter section are formed as a comb-line filter section with said first end of said first, second and third resonator elements being adjacent.

9. The antenna duplexer of claim 7, wherein at least one of said first coupled triplet filter section and said second first coupled triplet filter section are formed as an interdigital filter section with said first end of said third resonator element being opposite said first end of said first resonator element and said first end of said second resonator element.

10. The antenna duplexer of claim 9, wherein the coupling element of at least one of said first coupled triplet filter section and said second first coupled triplet filter section comprises a transmission line electrically connected to said first resonator element and said second resonator element.

11. The antenna duplexer of claim 7, wherein at least one of said first coupled triplet filter section and said second coupled triplet filter section further comprise:

a first capacitive stub section extending from said first resonator element;

a second capacitive stub section extending from said second resonator element; and third and fourth capacitive stub sections extending from said third resonator element, said third capacitive stub section being arranged to vertically overlap said first capacitive stub section and said fourth capacitive stub section being arranged to vertically overlap said second capacitive stub section.

12. The antenna duplexer of claim 11, wherein said coupling element of at least one of said first and second couplet triplet filters comprises a transmission line interposed between said second and third dielectric layers and at least partially vertically overlapping said first and second resonator elements.

13. The antenna duplexer of claim 11, wherein said coupling element of at least one of said first and second couplet triplet filters comprises a transmission line interposed between said first and second dielectric layers and being electrically connected to said first and second resonator elements.

14. The antenna duplexer of claim 11, wherein said third and fourth capacitive stub sections are positioned on said third resonator element to suppress a selected spurious frequency component.

15. The antenna duplexer of claim 14, wherein said third and fourth capacitive stub sections are positioned at a multiple of a half wavelength of said spurious frequency component from said first end of said third resonator element and an odd multiple of a quarter wavelength of said spurious frequency component from said second end of said third resonator element.

16. A comb-line dielectric filter having an asymmetrical response about a passband comprising:

- a laminate structure including a first ground plane layer, a first dielectric layer, a second dielectric layer, a third dielectric layer and a second ground plane layer, said second ground plane layer being electrically coupled to said first ground plane layer;
- a first resonator element, a second resonator element, and a third resonator element, said first resonator element and said second resonator element being interposed between said first and second dielectric layers and being arranged in a spaced apart relationship from one another, said third resonator element being interposed between said second and third dielectric layers and being laterally disposed between said first and second resonator elements, each of said first, second and third resonator elements having adjacent first ends electrically connected to said first and second ground plane layers and adjacent second ends which are open circuited;
- an input coupling structure operatively coupled to said first resonator element;
- an output coupling structure operatively coupled to said second resonator element; and
- a coupling element operatively coupled to said first and second resonator elements at a position spaced from said first ends to form a coupled triplet filter section having an asymmetrical filter response between said input coupling structure and said output coupling structure with all transmission zeros of the response on only one side of the filter pass band, the coupling element further comprising:
  - a first capacitive stub section extending from said first resonator;
  - a second capacitive stub section extending from said second resonator; and
  - third and fourth capacitive stub sections extending from said third resonator, said third capacitive stub section being arranged to vertically overlap said first capacitive stub section and said fourth capacitive stub section being arranged to vertically overlap said second capacitive stub section.

17. The laminate dielectric filter of claim 16, wherein said third and fourth capacitive stub sections are positioned on said third resonator element to suppress a selected spurious frequency component.

18. The laminate dielectric filter of claim 17, wherein said third and fourth capacitive stub sections are positioned at a multiple of a half wavelength of said spurious frequency component from said first end of said third resonator element and an odd multiple of a quarter wavelength of said spurious frequency component from said second end of said third resonator element.

19. The comb-line dielectric filter of claim 16, wherein said coupling element is interposed between said second and third dielectric layers and is magnetically coupled to said first and second resonator elements.

20. The comb-line dielectric filter of claim 19, wherein said coupling element includes a transmission line having a first capacitive end section overlapping said first resonator element and a second capacitive end section overlapping said second resonator element.

21. The comb-line dielectric filter of claim 16, wherein said coupling element includes a transmission line electrically connected to said first and second resonator elements.

22. A laminate dielectric filter having an asymmetrical band pass response comprising:

- a dielectric laminate structure including a first dielectric layer, a second dielectric layer and a third dielectric layer;
- a first resonator element and a second resonator element, said first resonator element and said second resonator element being interposed between said first and second dielectric layers, said first and second resonator elements being arranged in a spaced apart relationship from one another, each of said first and second resonator elements having a first end electrically connected to a circuit ground potential and a second end which is open circuited;
- an input coupling structure operatively coupled to said first resonator element;
- an output coupling structure operatively coupled to said second resonator element;
- a third resonator element, said third resonator element having a first end electrically connected to a circuit ground potential and a second end which is open circuited, said third resonator element being interposed between said second and third dielectric layers and being laterally disposed between said first and second resonator elements; and
- a coupling element, said coupling element being operatively coupled to said first and second resonator elements, said coupling element being spaced from said first ends of said first and second resonator elements to form a coupled triplet having an asymmetrical filter response between said input coupling structure and said output coupling structure with all transmission zeros of the response on only one side of the filter pass band, said coupling element further comprising:
  - a first capacitive stub section extending from said first resonator element;
  - a second capacitive stub section extending from said second resonator element; and
  - third and fourth capacitive stub sections extending from said third resonator element, said third capacitive stub section being arranged to vertically overlap said first capacitive stub section and said fourth capacitive stub section being arranged to vertically overlap said second capacitive stub section.

23. The laminate dielectric filter of claim 22, wherein said third and fourth capacitive stub sections are positioned on said third resonator element to suppress a selected spurious frequency component.

24. The laminate dielectric filter of claim 23, wherein said third and fourth capacitive stub sections are positioned at a multiple of a half wavelength of said spurious frequency component from said first end of said third resonator element and an odd multiple of a quarter wavelength of said spurious frequency component from said second end of said third resonator element.

25. An interdigital dielectric filter having an asymmetrical response about a passband comprising:

a laminate structure including a first ground plane layer, a first dielectric layer, a second dielectric layer, a third dielectric layer and a second ground plane layer, said second ground plane layer being electrically coupled to said first ground plane layer;

a first resonator element, a second resonator element, and a third resonator element, said first resonator element and said second resonator element being interposed between said first and second dielectric layers and being arranged in a spaced apart relationship from one another, said third resonator element being interposed between said second and third dielectric layers and being laterally disposed between said first and second resonator elements, each of said first, second and third resonator elements having a first end electrically connected to said first and second ground plane layers and a second end which is open circuited, the first end of said third resonator element being opposite said first end of said first resonator element and said second resonator element;

an input coupling structure operatively coupled to said first resonator element;

an output coupling structure operatively coupled to said second resonator element; and a transmission line electrically connected to said first and second resonator elements at a position spaced from said first ends to form a coupled triplet filter section having an asymmetrical filter response between said input coupling structure and said output coupling structure with all transmission zeros of the response above the filter pass band.

26. An antenna duplexer comprising:

a laminate structure including a first ground plane layer, a first dielectric layer, a second dielectric layer, a third dielectric layer and a second ground plane layer, said second ground plane layer being electrically coupled to said first ground plane layer;

a first coupled triplet filter section comprising:

a first resonator element, a second resonator element, and a third resonator element, said first resonator element and said second resonator element being interposed between said first and second dielectric layers and being arranged in a spaced apart relationship from one another, said third resonator element being interposed between said second and third dielectric layers and being laterally disposed between said first and second resonator elements, each of said first, second and third resonator elements having a first end electrically connected to said first and second ground plane layers and an open circuited second end; and a first coupling element operatively coupled to said first and second resonator elements at a position spaced from said first ends of said first and second resonator elements to form a coupled triplet filter section having an asymmetrical filter response between said input coupling structure and said output coupling structure with all transmission zeros of the response on only one side of the filter pass band;

a second coupled triplet filter section comprising:

a fourth resonator element, a fifth resonator element, and a sixth resonator element, said fourth resonator element and said fifth resonator element being interposed between said first and second dielectric layers and being arranged in a spaced apart relationship from one another, said sixth resonator element being interposed between said second and third dielectric layers and being laterally disposed between said first and second resonator elements, each of said fourth, fifth and sixth resonator elements having a first end electrically connected to said first and second ground plane layers and an open circuited second end; and a second coupling element operatively coupled to said fourth and fifth resonator elements at a position spaced from said first ends of said fourth and fifth resonator elements to form a coupled triplet filter section having an asymmetrical filter response with all transmission zeros of the response on only one side of the filter pass band;

a coupling stub interposed between said first coupled triplet filter section and said coupled triplet filter section;

a first port coupled to said first coupled triplet filter section;

a second port coupled to said second coupled triplet filter section; and a third port coupled to said coupling stub.

* * * * *

UNITED STATES PATENT AND TRADEMARK OFFICE
CERTIFICATE OF CORRECTION

PATENT NO. : 6,597,259 B1
DATED : July 22, 2003
INVENTOR(S) : Peters; James Michael It is certified that error appears in the above-identified patent and that said Letters Patent is hereby corrected as shown below:

Drawings,
Fig. 2, "C3" associated with Z22a should read -- C2 --
Fig. 5, "Co" associated with Z11b and Z13 should read -- Ca --; and "Co" associated with Z33b and Z13 should read -- Cb --
Fig. 6, "Co" (both occurrences) should read -- Ca --

Column 3,
Line 49, "across-sectional" should read -- a cross-sectional --

Column 4,
Line 50, "move" should read -- moves --

Column 5,
Line 10, "102C" should read -- 102c --
Line 11, "101B" should read -- 101b --
Line 16, "via's" should read -- vias --

Column 7,
Line 32, "two port" should read -- two-part --; and "four port" should read -- four-part --

Column 8,
Line 43, "graph" should read -- a graph --

Column 10,
Line 54, "comprise" should read -- comprises --

Signed and Sealed this

Ninth Day of March, 2004

JON W. DUDAS
*Acting Director of the United States Patent and Trademark Office*